United States Patent [19]

Jones

[11] Patent Number: 5,227,583
[45] Date of Patent: Jul. 13, 1993

[54] CERAMIC PACKAGE AND METHOD FOR MAKING SAME

[75] Inventor: Kenneth L. Jones, Escondido, Calif.

[73] Assignee: Microelectronic Packaging America, San Diego, Calif.

[21] Appl. No.: 747,729

[22] Filed: Aug. 20, 1991

[51] Int. Cl.$^5$ .............. H01L 23/02; H01L 21/465; H05K 9/00; H01R 43/00
[52] U.S. Cl. .............................. 174/52.4; 29/854; 29/885; 174/35 R; 437/228; 257/678
[58] Field of Search .............. 174/52.1, 52.4, 51, 174/35 R, 35 MS; 29/592.1, 854, 885, 874; 437/218, 228; 428/615, 620, 621; 357/74; 156/625, 664

[56] References Cited

U.S. PATENT DOCUMENTS

| | | | |
|---|---|---|---|
| 4,320,438 | 3/1982 | Ibrahim et al. | 361/401 |
| 4,753,820 | 6/1988 | Cusack | 427/96 |
| 4,761,518 | 8/1988 | Butt et al. | 174/52 |
| 4,801,765 | 1/1989 | Moyer et al. | 174/52.4 |
| 4,874,721 | 10/1989 | Kimura et al. | 437/209 |
| 4,890,153 | 12/1989 | Wu | 357/74 |
| 4,906,802 | 3/1990 | Castleman | 174/52.4 |
| 4,933,741 | 6/1990 | Schroeder | 357/70 |
| 4,992,628 | 2/1991 | Beppu et al. | 174/52.4 |
| 5,012,323 | 4/1991 | Farnworth | 357/75 |

Primary Examiner—Leo P. Picard
Assistant Examiner—B. Lee Ledynh
Attorney, Agent, or Firm—Antonio R. Durando; Harry M. Weiss

[57] ABSTRACT

A semiconductor package comprises a ceramic base component, a plurality of bonding pads of an electrically conductive metallic material, first and second electrically conductive buses, a signal shielding component which contains first and second electrically conductive plates electrically insulated from each other by a high temperature dielectric material wherein the shielding component is bonded to the base component outward of the bonding pad and the buses. A layer of a dielectric material covers the surface of the shielding component and a glass frit is bonded to the layer of dielectric material. The frit has the leads that extend from a metallic lead frame embedded in its outer surface. The leads, the dielectric layer and the signal shielding component are in substantial alignment. The leads are electrically connected to the bonding pad and the first and second electrically conductive layers are connected to the first and second electrically conductive buses. A method of forming the package comprises depositing, in sequential order and in predetermined areas upon a prefired ceramic base component, the metallic materials, such as precious metals and precious metal alloys, the high temperature dielectrics and the glass frit. A semiconductor chip which is electrically connected to the other electrically conductive components can be hemetically sealed inside the package by sealing an impervious lid to the package.

12 Claims, 1 Drawing Sheet

U.S. Patent
July 13, 1993
5,227,583
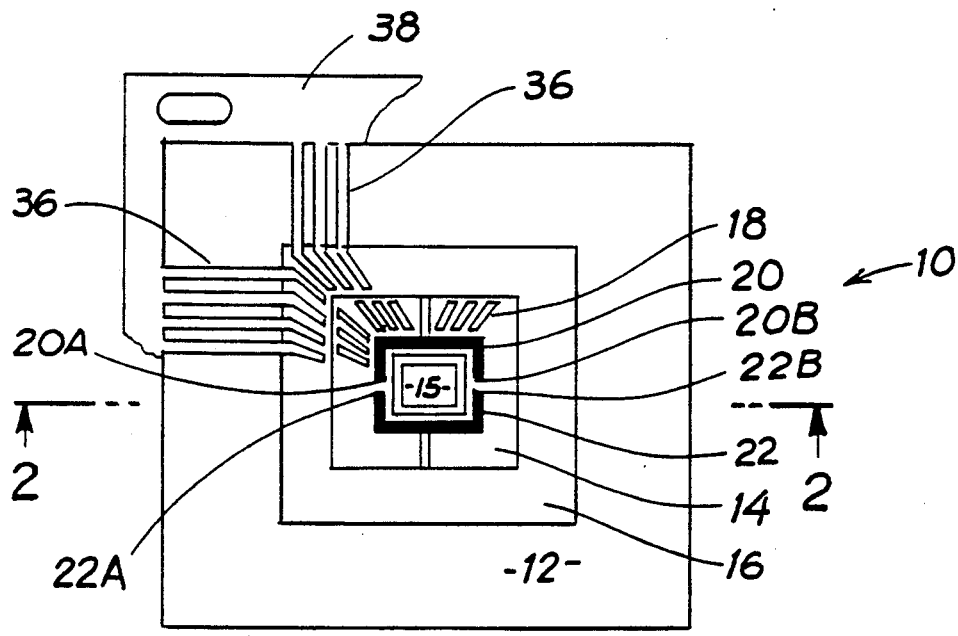
FIG. 1
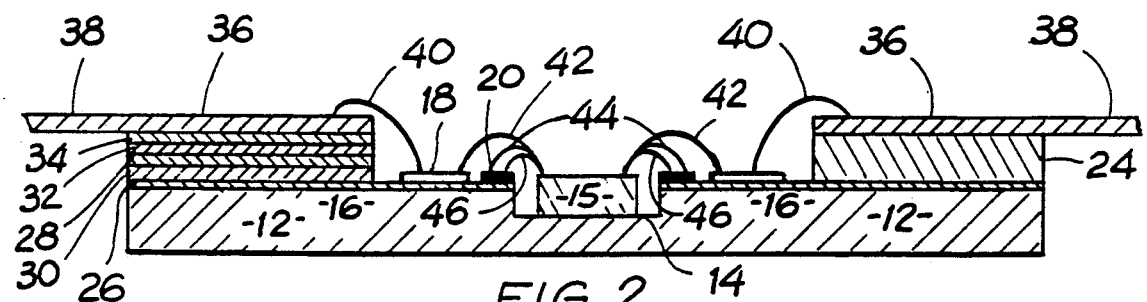
FIG. 2
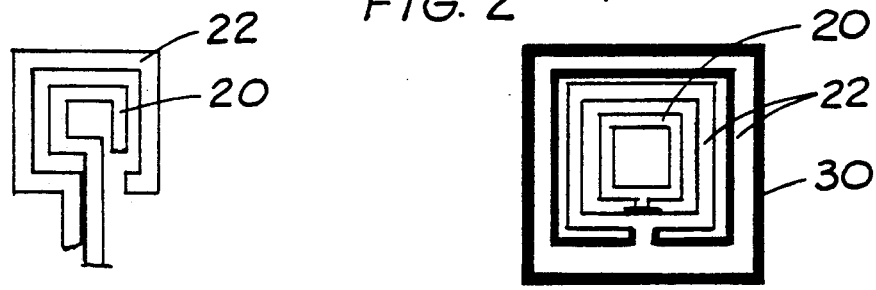
FIG. 3
FIG. 4

CERAMIC PACKAGE AND METHOD FOR MAKING SAME

BACKGROUND OF THE INVENTION

This invention relates to the packaging of electronic devices, and, more particularly, to the structure upon which integrated circuits and the like are supported for inserting into an electronic circuit assembly.

Integrated circuits are electronic devices that are extremely miniaturized, so that hundreds or even thousands of individual circuits and active elements are formed on a chip that may be only $\frac{1}{4}$ inch on a side. The reduction in size of such circuits reduces their weight and volume requirements, and also increases their operating speeds because the distances that electrons must travel are reduced. The widespread adoption of integrated circuitry has revolutionized many areas of electronics.

The integrated circuits themselves are extremely small and fragile. They must therefore be packaged and protected in a manner that permits external electrical connections to be made, and permits the integrated circuits to be handled in a normal manner during the assembly and repair of electronic devices that may utilize one or many such packaged integrated circuits.

One approach to packaging is to attach the integrated circuit to a substrate. The substrate supports the integrated circuit, and provides electrical connection points. Fine wires are attached between pads on the integrated circuit and pads on the substrate, and typically electrical conductor paths (termed "traces") extend from the pads on the substrate to other locations on the substrate that are spaced apart sufficiently that external connections can be readily made.

The substrate is normally electrically nonconducting, so that there is a natural insulation barrier between the various conductor traces that run across the surface of the substrate. The mounted integrated circuit is also electrically isolated on its bottom side, and can be electrically isolated on the top side by applying an insulation layer. One popular material of construction of the substrate is an organic resin material that is readily formed and also is nonconducting. These resin boards, known as printed circuit boards, are often found inside commercial and industrial electronic systems such as computers, radios and televisions. Mounting of the integrated circuit on the resin board insulates it electrically from the surroundings on its bottom side, and a layer of liquid resin is often spread over the top of the integrated circuit and allowed to harden, substrate electrically insulate the integrated circuit on the top side.

An alternative approach has been to use a piece of ceramic as a substrate, and to join the conductor traces run across the surface of the substrate to provide external electrical connections. A cover or lid can be attached over the integrated circuit to protect it. Such a package is known as a hermetic package, because it provides an electrically insulating, long-lasting, completely sealed support for the electronic device mounted upon it that is impervious to external substances such as moisture that could damage the integrated circuit. The preparation of hermetic packages presents different, and typically more complex, problems than does the preparation of nonhermetic packages, which are not impervious to moisture, because of restrictions on the materials and techniques of construction. The present invention is applicable to such hermetic packaging for electronic devices.

The following United States Patents, which are incorporated herein by reference, disclose various ceramic packages and techniques for making such packages.

U.S. Pat. No. 4,320,438 discloses a multi-layer ceramic package having a plurality of ceramic lamina each having a conductive pattern and in which there is an internal cavity within which there is a chip or a chip array. The chip or chip array is connected through short wire bonds to the ceramic lamina which have a conductive pattern. The conductive patterns on the various layers are interconnected.

U.S. Pat. No. 4,753,820 discloses a leadless ceramic package in which the bond pads on the pre-fired ceramic which are furthest from the center of the package are wider than those pads closest to the center. The bond pads are deposited by methods well known in the art such as photolithographic deposition.

U.S. Pat. No. 4,761,518 discloses a package in which a semiconductor casing is formed of a ceramic-glass-metal composite material with a lead frame embedded in a base component. The lead frame may include holes to mechanically interlock with the composite material. The patent relates to both ceramic dual-in-line packages (CERDIP) and ceramic four-sided packages (CERAQUAD).

U.S. Pat. No. 4,801,765 discloses a semiconductor package having external contacts to the chip provided by interdigitated leads formed from upper and lower lead frames. The lower lead frame includes a paddle for mounting the chip. The upper lead frame initially has its leads tied together and a center portion is removed by punching to fit the size of the chip.

U.S. Pat. No. 4,874,721 discloses a method of manufacturing a multichip package. The package comprises a ceramic multilayer substrate having a multilayer circuit wiring therein and input/output pins connected to a lower surface of the multilayer substrate. A first vertical wiring is formed on an upper layer of the first polyimide insulating layer. A plurality of semiconductor elements each having a second polyimide insulating layer and a second vertical wiring are connected to the first polyimide insulating layer and the first vertical wiring.

U.S. Pat. No. 4,890,153 discloses a package having a ceramic layer containing an inner row of bonding pads and an outer row of bonding pads. Bonding wires extend from the bonding pads on the VLSI die to the opposing pads on the inner and outer rows to provide an electrical interface between the die and the packages. The inner and outer bonding pads are connected by metallized fingers to conductive pads which provide a power and signal interface.

U.S. Pat. No. 4,906,802 discloses a package having a first molded section having a first predetermined shape and a second molded section having a second predetermined shape. One of the molded sections is made from a non-conductive material and the other is made from a non-conductive material that is capable of receiving a deposit of conductive material. A conductive material is deposited on the outer exposed surface of the molded section capable of receiving the deposit. This particular molded section has an outer surfaces that defines a plurality of non-intersecting, continuous paths that form the input/output leads on the molded chip carrier body. A protective cap can be placed over an electronic chip mounted within the package.

U.S. Pat. No. 4,933,741 discloses that a ground plane for an electrical conductor can comprise a plurality of isolated segments to provide alternate conductors having a lower impedance than the associated plurality of conductors. The segmented ground plane is electrically isolated from and maintained substantially in parallel with the conductors by means of an insulating layer such as polyimide.

U.S. Pat. No. 4,992,628 discloses a package having a glass material selectively deposited on a base substrate to form at least one discrete void or recess for housing an integrated circuit chip. The lead frame having a plurality of leads and the ground plane are both embedded in the glass material that is selectively deposited. The ground plane may be a layer of conductive material physically separated from the die attach pad by the ceramic or glass thus is electrically isolated from the pad. The package utilizes low temperature sealing glass and has reduced lead to lead capacitance.

U.S. Pat. No. 5,012,323 discloses a package incorporating a pair of semiconductor dice on a single lead frame having a wire-bonding region at each end of a die-attachment region which has both an upper and lower surface. The first of the pair of dice is back bonded to the upper surface of the die attachment region and the second is face bonded to the lower surface of the die attachment region. Electrical interconnection between the second die and the lead frame pass through an aperture in the lead frame.

Most of the cost of conventional multilayered packages is incurred in the complex series of steps requires to fabricate the packages. Thus, "cost" is a way of expressing the totality of the technical difficulties in preparing the packages. Conducting channels termed vias can be formed through the ceramic substrate, and the pins can be attached to one side of the vias. Several types of electrically conducting materials can be used in the conducting traces on the top side of the base and connected together ed to end to form series paths. The portion of the trace nearest the integrated circuit is gold to permit attachment substrate aluminum wires extending to the integrated circuit. The portion of the trace adjacent the vias is an alloy of silver and palladium to prevent leaching of the silver into the solder used to connect the two. The intermediate portion of the trace is silver. Each portion of the path must be separately deposited on the substrate. Yields of final, good quality packages are reduced as the number of individual steps increases, simply because there are always some failures in each individual step. The complex structure is also prone to service failures related to the mode of fabrication, such as failures at the joints between the various segments of the top-surface conduction traces or separation of the pins.

For these and other reasons, the cost of multilevel ceramic packages has remained relatively high. It would be desirable to develop a multilayered package that has significantly reduced cost, reflecting a technically less complex method of fabrication, is of simpler construction so as to be more reliable in service, and which can accommodate increasingly smaller sized semiconductors chips. The present invention fulfills this need, and further provides related advantages.

It is believed, therefore, that a ceramic package having a lower cost and which exhibits improved overall performance of the semiconductor devices represents an advancement in the art.

SUMMARY OF THE INVENTION

The present invention provides a multilayered ceramic package for electronic devices having reduced costs and fabrication complexity due to the significantly reduced number of fabrication steps required, as compared with conventional multilayered assemblies. The packaging is more reliable in service than prior packages used in comparable functions, because of the reduced complexity of the structure and structural change. The package permits reduction of the packaging complexity for certain applications, because higher electrical conductivity with reduced interference at elevated frequency can be achieved.

In accordance with one aspect of this invention there is provided a semiconductor package that comprises a ceramic base component, a bonding pad of an electrically conductive metallic material, first and second electrically conductive buses, a signal shielding component which contains first and second electrically conductive plates electrically insulated from each other by a high temperature dielectric material wherein the shielding component is bonded to the base component outward of the bonding pad and the buses. A layer of a dielectric material covers the surface of the shielding component and a glass frit is bonded to the layer of dielectric material. The frit has the leads that extend from a metallic lead frame embedded in its outer surface. The leads, the dielectric layer and the signal shielding component are insubstantial alignment and the leads are electrically connected to the bonding pad and the first and second electrically conductive layers are connected to the first and second electrically conductive buses.

In accordance with another embodiment of this invention there is provided a method for producing a ceramic package that comprises the steps of: (a) providing a pre-fired ceramic base component having a first portion and a second portion outward from the first portion, (b) forming an electrically conductive bonding pad, first and second electrically conductive buses and a first electrically conductive plate by depositing an electrically conductive metallic material upon the second portion of the ceramic base component in preselected and isolated area, preferably by a photoetchable thick film containing an electrically conductive metallic material, (c) depositing a first dielectic layer upon the first electrically conductive plate and thereafter (d) depositing a second plate of an electrically conductive metallic material, preferably by a thick film, to thereby provide a signal shielding component having the first and second plates and the dielectric material in upon substantial alignment, (e) depositing a second dieelectric layer upon the second plate and thereafter (f) providing a glass frit in which the leads of a semiconductor lead frame are positioned in alignment with the signal shielding component and (g) heating the resulting assembly to enable the leads to become imbedded into the glass.

BRIEF DESCRIPTION OF THE DRAWINGS

FIG. 1 depicts a plan view of one embodiment of a ceramic package that is made in accordance with the present invention.

FIG. 2 is a cross section taken along line 2—2 of FIG. 1.

FIG. 3 and FIG. 4 are illustrations of two additional embodiments for positioning buses in accordance with the present invention.

DETAILED DESCRIPTION

For a better understanding of the present invention together with other and further objects, advantages and capabilities thereof, references made to the following detailed description and appended claims in connection with the above summary of the invention and the brief description of the drawings.

With particular reference to FIG. 1 and 2 a ceramic package 10 is shown which has a ceramic base component 12 which has a portion 14, (recessed in the embodiment shown but such a recess is not essential for receiving a semiconductor chip 15) and a second portion 16 (unrecessed in the embodiment shown) which is located outwardly from said first portion 14. Bonding pads 18 of an electrically conductive metallic material are disposed over a first area of the second portion 16 of the ceramic base component 12. This allows the lead frame to be extended toward the first portion for smaller semiconductor chips. For example, photoetched gold can be used to apply a one mil spacing and two mil lines. Alternatively, screen printing or vacuum deposition can be used for forming the conductive paths. Thus when the package is used in high frequency semiconductor applications, even though the density of leads is relatively high as previously described, the interference in the semiconductor circuits is significantly reduces as compared to the interference in prior designs. The electrically conductive material is preferably a precious metal or a precious metal alloy. Particularly preferred metallic materials are metals selected from silver, gold, palladium and platinum and alloys thereof. Especially preferred are silver-palladium alloys. A first bus 20 of an electrically conductive metallic material covers a second area of the second portion of the base component 12. A second bus 22 also of an electrically conductive metallic material covers a third area of the second portion 16 of the base component 12.

In the embodiment shown in FIGS. 1 and 2 buses 20 and 22 each extend almost 180° around the base component 12, however, the ends, 20A, 20B, 22A and 22B, of the first and second buses 20 and 22, respectively, are sufficiently removed from each other so as to be electrically insulated from each other. In an alternative embodiment, the first and second buses can be generally concentric. In an additional embodiment the foregoing buses can be oriented at different layers. For ease of manufacture, the material for the first bus 20 and second bus 22 are preferably of the same material as the bonding pad 18.

A signal shielding component 24 is bonded to the base component 12 outwardly of and electrically insulated from the bonding pad 18. The shielding component 24 has first and second electrically conductive metallic plates 26 and 28 electrically insulated from each other by a first layer 30 of a dielectric material. As is shown in FIG. 2, the plates 26 and 28 and the first layer 30 are substantially in alignment. The first electrically conductive metallic plate 26 is electrically connected to the first bus 20 and the second electrically conductive metallic plate 28 is electrically connected to the second bus 22. In an embodiment having multiple layers the first metallic plate 26 and first bus 20 can be spaced apart in a vertical direction from second metallic plate 28 and second bus 20, thus, these buses can be arranged as are the metal plates as shown in the shielding component 24.

A second layer 32 of a dielectric material covers the surface of the shielding component 24 that is generally parallel to the surface that is bonded to the base component 12. A glass frit 34 covers the second layer 32 of dielectric material and has the leads 36 that extend from the metallic lead frame 38 embedded in the glass frit. The leads 36, the second layer 32 and the signal shielding component 24 are substantially in alignment. The leads 36 are electrically insulated from the shielding component 24 including plates 26, 28 and buses 20 and 22 and are electrically connected to the bonding pads 18 by a first set of bonding wires 40.

With particular reference to FIG. 2 bonding pads 18 are electrically connected to semiconductor chip 15 by a second set of bonding wires 42 and the first bus 20 is electrically connected to chip 15 by a third set of bonding wires 44. The second bus 22 is electrically connected to chip 15 by a fourth set of bonding wires 46. In the embodiment shown, the first metallic plate 26 and the first bus 20 can be the ground and the second metallic plate 28 and the second bus 22 can be the power, however, the power and the ground can be reversed or concentrically disposed if desired While bonding wires have been shown for ease of illustration as the method for providing electrical connections, other techniques, such as selectively depositing metal conductive traces as previously described, can be used to provide the electrical paths.

While it is preferred to use thick film technology in the fabrication of the packages of this invention for depositing the electrically conductive metallic materials, any of the techniques known to the manufacture of semiconductor industry can be used to deposit the electrically conductive metallic materials such as photoetching, screening, plating, photodeposition vapor depositing and the like.

Ceramics that are useful in the practice of the present invention comprise those selected from the group consisting of $Al_2O_3$, $MgO$, $AlN$, $Si_3N_4$, $BN$, $SiC$, $BeO$, $TiO_2$, $Zr_2O$ and mixtures thereof. Aluminum nitride and aluminum oxide are preferred due to pressing and thermal characteristics. The glasses that are useful con be selected from the group consisting of silicate, borosilicate, phosphate, zinc-borosilicate, soda-lime-silica, lead silicate and lead-zinc-silicate glasses. Suitable dielectrics 30, 32 include high temperature dielectrics that will withstand temperatures in excess of 500° C., such as the inorganic materials such as glass, glass with mica, borosilicate, lead silicate, porcelain, alumina, beryllia, forsterite or steatite or organic dielectric materials that will withstand the above high temperatures. Borosilicates are preferred because they exhibit high dielectric properties and resist migration of silver bearing alloys.

While there has been shown and described what are considered to be the preferred embodiment of this invention, various changes may become apparent to those skilled in the art. These embodiments are not presented as limiting the invention but are set forth as an explanation of the invention which is defined by the appended claims.

What is claimed is:

1. A ceramic package suitable for a semiconductor device comprising
    a) a ceramic base component having a first portion for receiving a semiconductor chip and a second portion outward from said first portion,
    b) a plurality of bonding pads of an electrically conductive metallic material covering a first area of said second portion of said base component and suitable for being electrically connected to said chip, c) a first bus of an electrically conductive metallic material covering a second area of said second portion of said base component and suitable for being electrically connecting to said chip, d) a second bus of an electrically conductive metallic material covering a third area of said second portion of said base component and suitable for being electrically connecting to said chip, said bonding pad, said first and second buses being electrically insulated from each other, e) a signal shielding component bonded to said base component outward of and electrically insulated from said bonding pad and said first and second buses, said shielding component comprising first and second electrically conductive metallic layers electrically insulated from each other by a first layer of a dielectric material, all of said layers being substantially in alignment, and said first electrically conductive metallic layer being electrically connected to said first bus and said second electrically conductive metallic layer being electrically connected to said second bus, f) a second layer of a dielectric material covering the surface of said shielding component opposing the surface bonded to said base component, and g) a glass frit bonded to said second layer of dielectric material having the metallic leads that extend from a metallic lead frame embedded therein, wherein said leads and said signal shielding component ar in substantial alignment an said leads are electrically insulated from said shielding component and are connected to said bonding pads.

2. A semiconductor package according to claim 1 wherein said one of said electrically conductive metallic layers is a ground plate and the other electrically conductive metallic layer is a power plate whereby when s id package is utilized in, high frequency semiconductor applications and where the density of leads is relatively high, the interference in the semiconductor circuits is significantly reduced.

3. A semiconductor package according to claim 2 wherein said electrically conductive metallic materials are precious metal materials.

4. A semiconductor package according to claim 3 wherein said precious metal material is selected from the group consisting of gold, silver, palladium and platinum metal and alloys of said metals.

5. A semiconductor package according to claim 3 wherein said precious metal material is a silver-platinum alloy.

6. A semiconductor package according to claim 1 wherein said ceramic in said base component is selected from the group consisting of $Al_2O_3$, $MgO$, $AlN$, $Si_3N_4$, $BN$, $SiC$, $BeO$, $TiO_2$, $Zr_2O$ and mixtures thereof.

7. A semiconductor package according to claim 1 wherein said first and second buses are generally concentric.

8. A semiconductor package according to claim 1 wherein said first conductive metallic layer and said first bus are spaced apart vertically from said second conductive metallic layer.

9. A semiconductor package according to claim 1 wherein said dielectric material is borosilicate.

10. A method of forming a semiconductor package comprising a) providing a prefered ceramic base component having a first portion and a second portion outward of said first portion, b) depositing an electrically conductive material over a first segment of said second portion adjacent said first portion, to provide a plurality of electrically conductive bonding pads, c) forming a signal shielding component by depositing, in sequence and in substantial alignment, a first layer of an electrically conductive metallic material, a layer of a first dielectric material and a second layer of an electrically conductive metallic material, d) bonding an external surface of said signal shielding component to said ceramic base component, e) depositing a layer of a second dielectric material on the opposing external surface of said shielding component, f) depositing a layer of glass frit upon the layer of said second dielectric material and between said bonding pad and said shielding component and positioning a metallic lead frame having its leads extending therefrom substantially in alignment with said signal shielding component and g) firing said package to melt said frit thereby embedding said leads into said glass frit.

11. A method according to claim 10 wherein said metallic conductive materials are formed by depositing a photoetchable thick film material and thereafter etching the conductive segments.

12. A method according to claim 10 wherein said metallic conductive materials are formed by screening.

* * * * *